United States Patent
Torimi et al.

(10) Patent No.: US 11,261,539 B2
(45) Date of Patent: Mar. 1, 2022

(54) METHOD FOR MANUFACTURING REFORMED SIC WAFER, EPITAXIAL LAYER-ATTACHED SIC WAFER, METHOD FOR MANUFACTURING SAME, AND SURFACE TREATMENT METHOD

(71) Applicant: Toyo Tanso Co., Ltd., Osaka (JP)

(72) Inventors: Satoshi Torimi, Kanonji (JP); Yusuke Sudo, Kanonji (JP); Masato Shinohara, Kanonji (JP); Youji Teramoto, Kanonji (JP); Takuya Sakaguchi, Kanonji (JP); Satoru Nogami, Kanonji (JP); Makoto Kitabatake, Kanonji (JP)

(73) Assignee: TOYO TANSO CO., LTD., Osaka (JP)

( * ) Notice: Subject to any disclaimer, the term of this patent is extended or adjusted under 35 U.S.C. 154(b) by 114 days.

(21) Appl. No.: 16/495,282

(22) PCT Filed: Mar. 20, 2018

(86) PCT No.: PCT/JP2018/011221
§ 371 (c)(1),
(2) Date: Dec. 2, 2019

(87) PCT Pub. No.: WO2018/174105
PCT Pub. Date: Sep. 27, 2018

(65) Prior Publication Data
US 2020/0095703 A1    Mar. 26, 2020

(30) Foreign Application Priority Data

Mar. 22, 2017 (JP) .............................. JP2017-055240
Oct. 31, 2017 (JP) .............................. JP2017-210585

(51) Int. Cl.
H01L 21/02 (2006.01)
C30B 25/18 (2006.01)
(Continued)

(52) U.S. Cl.
CPC ............ *C30B 25/186* (2013.01); *C30B 25/20* (2013.01); *C30B 29/36* (2013.01);
(Continued)

(58) Field of Classification Search
CPC ....... C30B 25/186; C30B 25/20; C30B 29/36; H01L 21/02378; H01L 21/0243;
(Continued)

(56) References Cited

U.S. PATENT DOCUMENTS 10,020,366 B2 *   7/2018  Mahadik ........... H01L 21/02658
2006/0011128 A1   1/2006  Ellison et al.
(Continued)

FOREIGN PATENT DOCUMENTS

JP     2008-16691 A    1/2008
JP     2008-311541 A   12/2008
(Continued)

OTHER PUBLICATIONS

International Search Report dated May 29, 2018, issued in counterpart International Application No. PCT/JP2018/011221 (2 pages).
(Continued)

*Primary Examiner* — Jaehwan Oh
(74) *Attorney, Agent, or Firm* — Westerman, Hattori, Daniels and Adrian, LLP (57) ABSTRACT

In a method for manufacturing a reformed SiC wafer 41 (a surface treatment method for a SiC wafer) having its surface that is reformed by processing an untreated SiC wafer 40 before formation of an epitaxial layer 42, the method includes a surface reforming step as described below. That is, the untreated SiC wafer 40 includes BPDs as dislocations parallel to an inside of a (0001) face, and TEDs. Property of the surface of the untreated SiC wafer 40 is changed so as to have higher rate in which portions having BPDs on the
(Continued)

surface of the untreated SiC wafer 40 propagate as TEDs at a time of forming the epitaxial layer 42.

12 Claims, 9 Drawing Sheets

(51) Int. Cl.
  *C30B 29/36* (2006.01)
  *H01L 29/34* (2006.01)
  *H01L 29/16* (2006.01)
  *C30B 25/20* (2006.01)
(52) U.S. Cl.
  CPC ...... *H01L 21/0243* (2013.01); *H01L 21/0262* (2013.01); *H01L 21/02378* (2013.01); *H01L 21/02529* (2013.01); *H01L 29/1608* (2013.01); *H01L 29/34* (2013.01)
(58) Field of Classification Search
  CPC ......... H01L 21/02433; H01L 21/02529; H01L 21/02658; H01L 29/1608; H01L 29/34
  See application file for complete search history.

(56) References Cited

U.S. PATENT DOCUMENTS

| | | | |
|---|---|---|---|
| 2008/0318359 A1 | 12/2008 | Yonezawa et al. | |
| 2013/0143396 A1* | 6/2013 | Sudarshan | C30B 25/186 438/503 |
| 2015/0128850 A1* | 5/2015 | Sudarshan | H01L 21/02019 117/95 |
| 2015/0129897 A1* | 5/2015 | Sudarshan | C30B 25/183 257/77 |
| 2016/0118257 A1 | 4/2016 | Kaneko et al. | |
| 2017/0114475 A1 | 4/2017 | Yabuki et al. | |
| 2018/0216251 A1 | 8/2018 | Aigo et al. | |

FOREIGN PATENT DOCUMENTS

| | | |
|---|---|---|
| JP | 2009-218575 A | 9/2009 |
| JP | 2010-265126 A | 11/2010 |
| JP | 2013-107788 A | 6/2013 |
| JP | 2015-196616 A | 11/2015 |
| JP | 5958949 B2 | 8/2016 |
| WO | 2017/018533 A1 | 2/2017 |

OTHER PUBLICATIONS

Written Opinion of the International Searching Authority (Form PCT/ISA/237) dated May 29, 2018, issued in counterpart International Application No. PCT/JP2018/011221 (14 pages).

Mahadik et al., "Mitigation of BPD by Pre-Epigrowth High Temperature Substrate Annealing", Materials Science Forum, (2016), vol. 858, pp. 233-236.

\* cited by examiner

| evaluated results of BPDs by using etch-pit method | | | |
|---|---|---|---|
| | forming epilayer after heating under Si vapor pressure (experiment 1) | forming epilayer after CMP (experiment 2) | CMP only (experiment 3) |
| number of BPDs | 101 | 348 | 4307 |
| BPD density(cm$^{-2}$) | 5.92 | 20.41 | 252.54 |
| BPD→TED conversion ratio(%) | 97.7 | 91.9 | |

METHOD FOR MANUFACTURING REFORMED SIC WAFER, EPITAXIAL LAYER-ATTACHED SIC WAFER, METHOD FOR MANUFACTURING SAME, AND SURFACE TREATMENT METHOD

TECHNICAL FIELD

The present invention mainly relates to a method for manufacturing an SiC wafer having low BPD density.

BACKGROUND ART

BPD density has been conventionally known as a value that affects performance of semiconductor devices manufactured by using SiC wafers. BPD is an abbreviation for Basal Plane Dislocation that is a dislocation parallel to an inside of an SiC (0001) face. In high BPD density, conduction in the semiconductor devices is likely to be degraded. Patent Document 1 discloses a method for reducing BPD density.

Patent Document 1 discloses a method for converting a tip of BPDs inside an SiC substrate to TEDs (Threading Edge Dislocation) by heating the SiC substrate before growth of an epitaxial layer under inert gas atmosphere. Similarly, Patent Document 1 discloses a method for converting the tip of BPDs to TEDs by heating the epitaxial layer formed in the SiC substrate under inert gas atmosphere. When such SiC substrate is subjected to epitaxial growth, instead of BPDs, TEDs propagate to the epitaxial layer due to the tip having TEDs. TED does not affect degradation in performance of the semiconductor devices. Accordingly, using this method enables BPD density in the SiC substrate to be reduced.

As with Patent Document 1, Non-Patent Document 1 discloses that BPDs inside the SiC substrate are converted to TEDs by heating the SiC substrate under argon (inert gas) atmosphere, and thereby BPD density and BPD density after epitaxial growth are reduced.

PRIOR-ART DOCUMENTS

Patent Documents

Patent Document 1: Japanese Patent Number 5958949

Non-Patent Documents

Non-Patent Document 1: "Mitigation of BPD by Pre-Epigrowth High Temperature Substrate Annealing", N. A. Mahadik, et.al., Materials Science Forum, 2016, Vol. 858, pp 233-236

SUMMARY OF THE INVENTION

Problems to be Solved by the Invention

Patent Document 1 and Non-Patent Document 1 disclose that BPDs are reduced by converting BPDs to TEDs at an inside of the SiC wafer (SiC substrate) or the epitaxial layer. However, in such method, it is necessary to conduct heat to the inside of the SiC wafer or the epitaxial layer. This tends to take long time in processing.

The present invention has been made in view of the circumstances described above, and a primary object of the present invention is to provide a method for manufacturing an SiC wafer with a configuration in which an epitaxial layer having low BPD density is formed in a short time, at a time of forming the epitaxial layer.

Means for Solving the Problems and Effects Thereof

Problems to be solved by the present invention are as described above, and next, means for solving the problems and effects thereof will be described.

A first aspect of the present invention provides a method for manufacturing a reformed SiC wafer on which its surface is reformed by treating an untreated SiC wafer that is an SiC wafer before formation of an epitaxial layer, the method including a surface reforming step as described below. The untreated SiC wafer includes, at least a surface, basal plane dislocations as dislocations parallel to an inside of a (0001) face. In the surface reforming step, property of the surface of the untreated SiC wafer is changed so as to have higher rate in which the basal plane dislocations on the surface of the untreated SiC wafer propagate as threading edge dislocations at a time of forming the epitaxial layer.

Accordingly, property of the surface, not an inside of the untreated SiC wafer, is changed to form the reformed SiC wafer, and to grow the epitaxial layer on the reformed SiC wafer. This can easily convert BPDs for degrading property of the semiconductor devices to TEDs that do not affect performance of the semiconductor devices. Therefore, it is possible to manufacture a reformed SiC wafer suitable for manufacturing of high-performance semiconductor devices. Particularly, BPDs can be reduced in a short treatment time by changing property of the surface, not the inside of the untreated SiC wafer.

In the method for manufacturing the reformed SiC wafer, it is preferable that, in the surface reforming step, {1-100} molecular layer steps are formed on a surface of the untreated SiC wafer.

Accordingly, BPD reduction may be promoted.

In the method for manufacturing the reformed SiC wafer, it is preferable that, in the surface reforming step, the basal plane dislocations generated on the surface of the untreated SiC wafer are converted to threading edge dislocations.

In the method for manufacturing the reformed SiC wafer, it is preferable that the untreated SiC wafer is subjected to planarization along with the surface reforming step.

Accordingly, a planarizing treatment and a surface reforming treatment are performed at the same time, which can shorten manufacturing steps.

In the method for manufacturing the reformed SiC wafer, it is preferable that performing the surface reforming step causes arithmetic mean roughness (Ra) on the surface after forming the epitaxial layer to be 1 nm or less.

Accordingly, the SiC wafer having low BPD density can be manufactured while improving surface roughness. This can manufacture more high-performance semiconductor devices.

In the method for manufacturing the reformed SiC wafer, it is preferable that, in the surface reforming step, the untreated SiC wafer is heated under Si vapor pressure.

Accordingly, since the surface of the reformed SiC wafer can be a molecularly stable state with few crystal defects, the epitaxial layer having a flat surface can be formed almost regardless of a method for forming the epitaxial layer.

A second aspect of the present invention provides a method for manufacturing an epitaxial layer-formed SiC wafer for which an epitaxial layer forming step of forming the epitaxial layer is implemented with respect to the reformed SiC wafer manufactured by using the method for manufacturing the reformed SiC wafer.

In the method for manufacturing the epitaxial layer-formed SiC wafer, it is preferable that a conversion ratio (%) of basal plane dislocation to threading edge dislocation, the conversion ratio (%) that is realized by implementing the surface reforming step with respect to the untreated SiC wafer to form {1-100} molecular layer steps and by performing the epitaxial layer forming step to the reformed SiC wafer to reduce the size of the basal plane dislocation at an initial stage of such formation of the epitaxial layer, is 5% or more higher than the conversion ratio (%) when the epitaxial layer is formed after the untreated SiC wafer is subjected to chemical mechanical polishing. The epitaxial layer-formed SiC wafer with similar characteristics is also achieved.

A third aspect of the present invention provides the epitaxial layer-formed SiC wafer having the following configuration. That is, the configuration includes an SiC wafer and an epitaxial layer formed on the SiC wafer. A surface of the SiC wafer includes basal plane dislocations as dislocations parallel to an inside of a (0001) face. The density of basal plane dislocation on the surface of the epitaxial layer is 5% or less of density of basal plane dislocation on the surface of the SiC wafer.

As described above, the epitaxial layer-formed SiC wafer having low BPD density can be achieved.

In the epitaxial layer-formed SiC wafer, it is preferable that arithmetic mean roughness (Ra) on the surface of the epitaxial layer of the SiC wafer is 1 nm or less.

Accordingly, the SiC wafer having low BPD density can be manufactured while improving surface roughness. This can manufacture more high-performance semiconductor devices.

In the epitaxial layer-formed SiC wafer, the following configuration is preferable. That is, only one epitaxial layer is formed on the SiC wafer. BPD density on the surface of the epitaxial layer is 5% or less of BPD density on the surface of the SiC wafer.

Accordingly, unlike Patent Document 1, even when only one epitaxial layer is formed, the epitaxial layer-formed SiC wafer having low BPD density can be achieved.

A fourth aspect of the present invention provides the following surface treatment method. That is, the SiC wafer includes basal plane dislocations as dislocations parallel to an inside of a (0001) face. A surface reforming step of changing property of the surface so as to have higher rate in which portions having basal plane dislocations propagate as threading edge dislocations at a time of forming the epitaxial layer, is implemented.

Accordingly, property of the surface of the untreated SiC wafer, not an inside thereof, is changed to form the reformed SiC wafer, and to grow the epitaxial layer on the reformed SiC wafer. This can easily convert BPDs for degrading property of the semiconductor devices to TEDs that do not affect performance of the semiconductor devices. Therefore, it is possible to manufacture a reformed SiC wafer suitable for manufacturing of high-performance semiconductor devices. Particularly, BPDs can be reduced in a short treatment time by changing property of the surface of the untreated SiC wafer, not the inside thereof.

EMBODIMENT FOR CARRYING OUT THE INVENTION

Next, an embodiment of the present invention will be described with reference to the drawings. Firstly, referring to FIG. 1, a high-temperature vacuum furnace 10 for using a heat treatment of this embodiment will be described.

Figure 1:
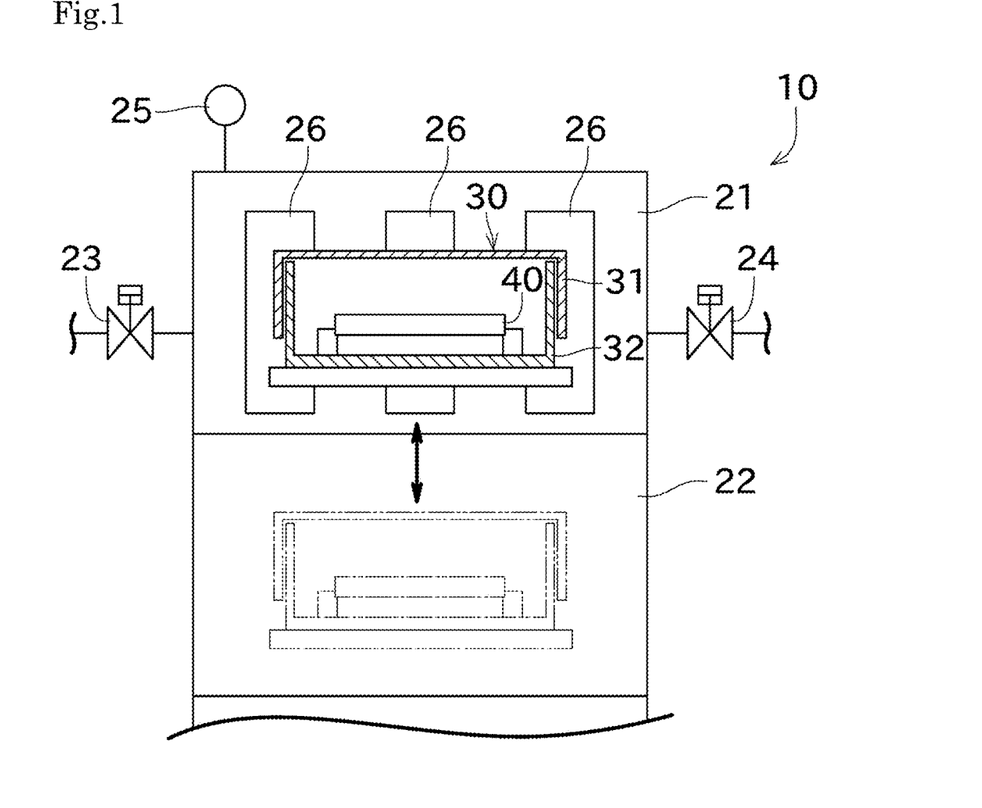
FIG. 1 A diagram for illustration of an outline of a high-temperature vacuum furnace for use in a surface reforming step according to the present invention.

As shown in FIG. 1, the high-temperature vacuum furnace 10 includes a main heating chamber 21 and a preheating chamber 22. The main heating chamber 21 is configured to heat a single crystal SiC substrate (untreated SiC wafer 40) made of, at least in its surface, single crystal 4H—SiC and the like, up to a temperature of 1000° C. or more and 2300° C. or less. The preheating chamber 22 is a space for preheating the untreated SiC wafer 40 before heating of the untreated SiC wafer 40 in the main heating chamber 21.

A vacuum-forming valve 23, an inert gas feed valve 24, and a vacuum meter 25 are connected to the main heating chamber 21. The vacuum-forming valve 23 is configured to adjust the degree of vacuum of the main heating chamber 21. The inert gas feed valve 24 is configured to adjust pressure of inert gas (for example, noble gas vapor such as Ar gas, that is, gas having poor reactivity with respect to solid SiC, excluding nitrogen gas) contained in the main heating chamber 21. The vacuum meter 25 is configured to measure the degree of vacuum of the interior of the main heating chamber 21.

Heaters 26 are provided in the main heating chamber 21. A heat reflection metal plate (not shown) is secured to a side wall and a ceiling of the main heating chamber 21. The heat reflection metal plate is configured to reflect heat of the heaters 26 toward a central region of the main heating chamber 21. This provides strong and uniform heating of the untreated SiC wafer 40, to cause a temperature raise up to 1000° C. or more and 2300° C. or less. Examples of the heaters 26 include resistive heaters or high-frequency induction heaters.

The untreated SiC wafer 40 is heated while stored in a crucible (storing container) 30. The crucible 30 is placed on an appropriate support or the like, and the support is movable at least in a range from the preheating chamber to the main heating chamber. The crucible 30 includes an upper container 31 and a lower container 32 that are finable with each other. The lower container 32 of the crucible 30 is configured to support the untreated SiC wafer 40 so as to expose both main and back surfaces of the untreated SiC wafer 40. The main surface of the untreated SiC wafer 40 is an Si-face, which is a (0001) face when expressed in terms of crystal plane. The back surface of the untreated SiC wafer 40 is a C-face, which is a (000-1) face when expressed in terms of crystal plane. The untreated SiC wafer 40 may have an off angle with respect to the above-described Si-face and C-face. The main surface is one of two surfaces each having the largest region (an upper surface and a lower surface in FIG. 1) in the untreated SiC wafer 40, the surface on which the epitaxial layer is formed in the subsequent process. The back surface is a surface on a back side of the main surface.

The crucible 30 has its portion constituting wall surfaces (an upper surface, side surfaces, a bottom surface) that define an internal space for storing the untreated SiC wafer 40. Specifically, a tantalum layer (Ta), tantalum carbide layers (TaC and $Ta_2C$), and a tantalum silicide layer ($TaSi_2$ or $Ta_5Si_3$) are provided in this order from an external side to an internal space side of the crucible 30.

The tantalum silicide layer is heated and thus supplies Si to the internal space of the crucible 30. The crucible 30 includes the tantalum layer and the tantalum carbide layer, which can absorb surrounding C vapor. Accordingly, a high-purity Si atmosphere can be caused in the internal space at a time of heating. Instead of the tantalum silicide layer, an Si supply source such as solid Si may be arranged. In this case, such solid Si is sublimated at a time of heating, and thereby a high-purity Si vapor pressure can be caused in the internal space.

To perform a heat treatment of the untreated SiC wafer 40, the crucible 30 is firstly placed in the preheating chamber 22 of the high temperature vacuum furnace 10 as indicated by the dot-dash lines in FIG. 1, and preheated at an appropriate temperature (for example, about 800° C.). Then, the crucible 30 is moved to the main heating chamber 21 whose temperature has been elevated to a set temperature (for example, about 1800° C.) in advance. After that, the untreated SiC wafer 40 is heated while adjusting the pressure and the like. The preheating may be omitted.

Figure 2:
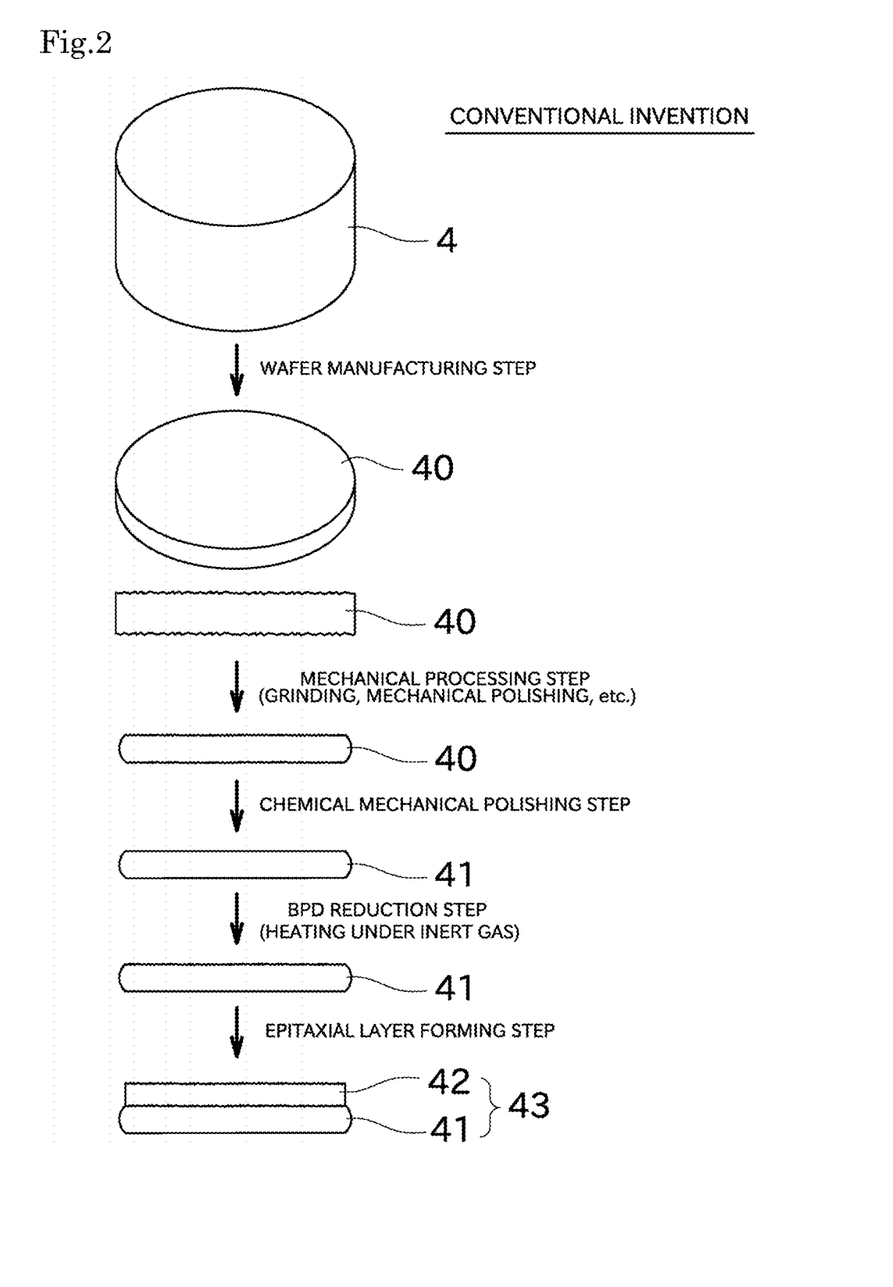
FIG. 2 A diagram schematically showing steps of manufacturing an epitaxial layer-formed SiC wafer in the conventional invention.
Figure 3:
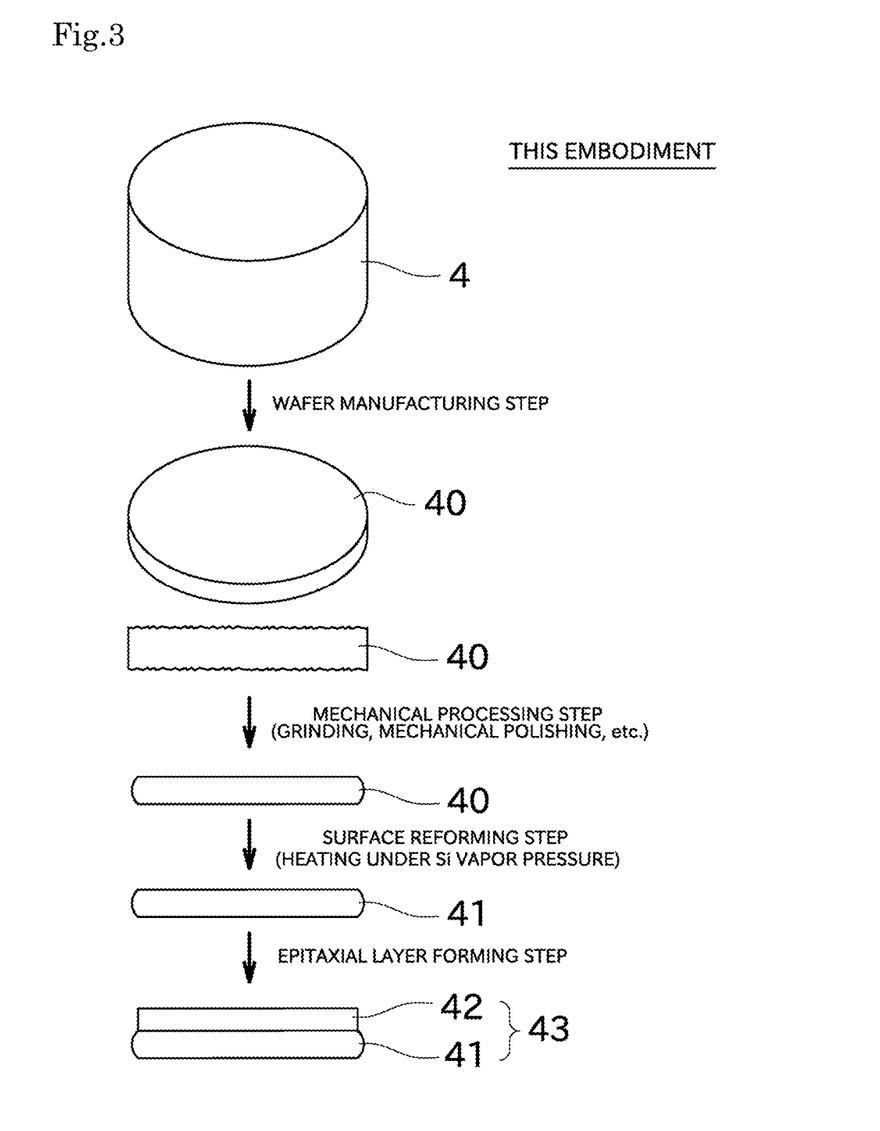
FIG. 3 A diagram schematically showing steps of manufacturing the epitaxial layer-formed SiC wafer.

Next, steps in which an epitaxial layer-formed SiC wafer 43 is manufactured from an ingot 4 will be described. Firstly, manufacturing steps in this embodiment will be described compared to the conventional manufacturing steps. FIG. 2 is a diagram schematically showing steps of manufacturing the epitaxial layer-formed SiC wafer 43 in the conventional invention. FIG. 3 is a diagram schematically showing steps of manufacturing the epitaxial layer-formed SiC wafer 43 in this embodiment.

The ingot 4 is a lump of single crystal SiC manufactured by a known sublimation method or solution growth method. As shown in FIG. 2 and FIG. 3, the ingot 4 made of SiC is firstly cut at predetermined intervals by cutting means such as a diamond wire. Thereby, the plurality of untreated SiC wafers 40 is manufactured from the ingot 4 (wafer manufacturing step). The untreated SiC wafers 40 may be manufactured by alternative methods. For example, the untreated SiC wafers 40 can be obtained in an wafer shape from the ingot 4 in which a damaged layer is formed by laser irradiation or the like. An SiC wafer made of, at least in its surface, single crystal SiC can be manufactured by treatment such as peeling as required after bonding a single crystal SiC substrate and a polycrystalline SiC substrate obtained from the ingot etc. to each other.

In this embodiment, an SiC wafer before a surface reforming step which will be described later is referred to as the untreated SiC wafer 40. The main and back surfaces of the untreated SiC wafer 40 has large surface roughness formed during the wafer manufacturing step. An SiC wafer after the surface reforming step is referred to as a reformed SiC wafer 41. The untreated SiC wafer 40 and the reformed SiC wafer 41 are collectively referred to as the SiC wafer.

Next, a mechanical processing step is implemented to the untreated SiC wafer 40. For example, grinding, mechanical polishing and the like are implemented as the mechanical processing step. Grinding is to mechanically grind the main surface or back surface of the untreated SiC wafer 40 by using a diamond wheel or the like. Grinding is a processing for obtaining the desired thickness in the untreated SiC wafer 40. Even when such grinding is implemented, the untreated SiC wafer 40 still has large surface roughness. Therefore, the surface of the untreated SiC wafer 40 is planarized by mechanical polishing (excluding chemical mechanical polishing; the same shall apply hereinafter.) that is a mechanical processing using abrasive grains finer than that in grinding.

The above-described steps in the conventional invention are same as that in this embodiment (although details will be described later, a part of the mechanical processing step can be omitted in this embodiment.). The untreated SiC wafer 40 has a certain surface roughness even when mechanical polishing is implemented. Therefore, in the conventional invention, the surface of the untreated SiC wafer 40 is further planarized by chemical mechanical polishing (CMP). The chemical mechanical polishing is a processing for planarizing the surface by means of mechanical polishing using abrasive grains and by means of chemical reaction by components contained in polish liquid.

Although an epitaxial layer forming step may be generally implemented without the surface reforming step after a chemical mechanical polishing step, a method for implementing a BPD reduction step has been known, as shown in Patent Document 1, etc. The BPD reduction step is a step of reducing BPDs by treating the untreated SiC wafer 40. In this embodiment, since especially the surface of the untreated SiC wafer 40 is treated, the BPD reduction step in this embodiment is referred to as especially the surface reforming step. Such steps are implemented, which causes reduction in BPD density (the number of BPDs per unit region) of the epitaxial layer 42 that is subsequently formed.

Figure 4:
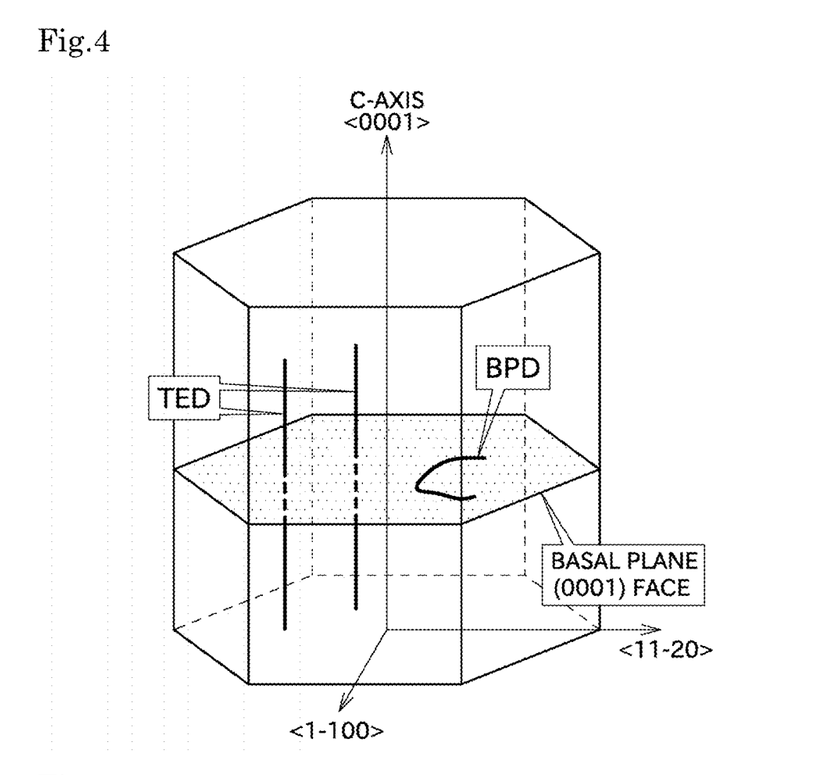
FIG. 4 A diagram showing dislocation orientations of TEDs and BPDs.
Figure 5:
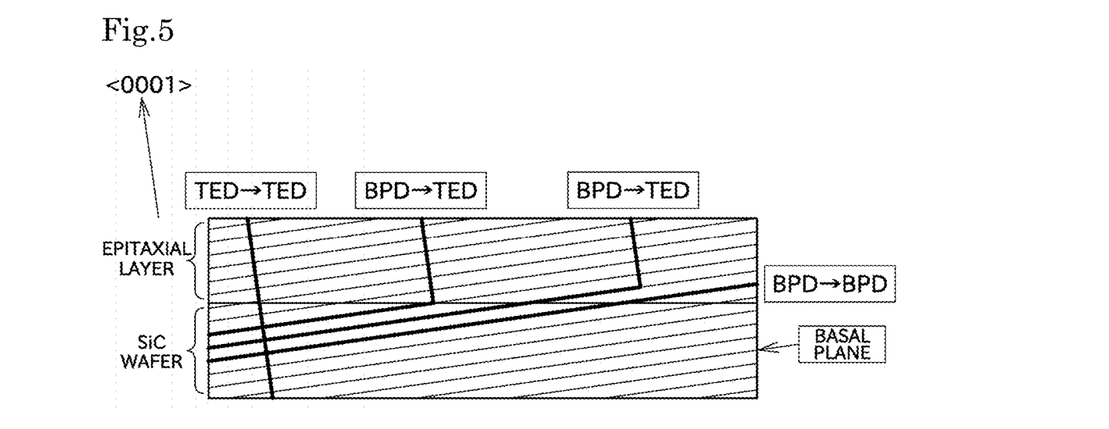
FIG. 5 A diagram showing a state of maintaining or changing dislocations when the epitaxial layer is formed on the SiC wafer.

BPDs and TEDs will be described with reference to FIG. 4 and FIG. 5. FIG. 4 is a diagram showing dislocation orientations of TEDs and BPDs. FIG. 5 is a diagram showing a state of maintaining or changing dislocations when the epitaxial layer is formed on the SiC wafer.

As shown in FIG. 4, BPD is a dislocation parallel to an inside of an SiC (0001) face. The (0001) face corresponds to a basal plane. In high BPD density, conduction performance in semiconductor devices is likely to be degraded. As shown in FIG. 4, each TED is a type of dislocations parallel to a <0001> direction of the SiC. Therefore, each TED is formed so as to vertically penetrate the basal plane. TEDs are supposed to have no effect on performance of the semiconductor devices.

The untreated SiC wafer 40 is manufactured by cutting the ingot 4 inclined by a predetermined angle (off angle) with respect to the basal plane. It is preferable that the predetermined angle is 0.1° or more, and 4° or less or 8° or less, with respect to a <11-20> direction or a <1-100> direction, for example. Therefore, the surface (main surface) of the SiC wafer is inclined with respect to the basal plane, as shown in FIG. 5.

The epitaxial layer is formed on the SiC wafer, and thereby the dislocation propagates as it is or changes to other dislocations and then propagates. Specific cases involve, as shown in FIG. 5, a situation in which TEDs propagate as it is, a situation in which BPDs are converted to TEDs and then propagates, and a situation in which BPDs propagate as it is. BPDs that cause reduction in performance of the semiconductor devices can be reduced by converting BPDs to TEDs. By performing the surface reforming step of this embodiment, at a time of subsequently forming the epitaxial layer, probability in which portions having BPDs before the surface reforming step propagate as TEDs at a time of forming the epitaxial layer can be increased. Specifically, it is conceivable that, on the surface of the reformed SiC wafer 41 at the end of the surface reforming step, BPDs are converted to TEDs, property is changed so that BPDs are easily converted to TEDs, or both cases occur. Performing the surface reforming step of this embodiment may cause BPDs to be less likely to propagate. Specifically, it is conceivable that, on the surface of the reformed SiC wafer 41 at the end of the surface reforming step, property of the surface of the reformed SiC wafer 41 is changed so that BPDs are less likely to propagate to the epitaxial layer 42.

In the conventional invention, heating under inert gas is performed as the surface reforming step. Accordingly, BPDs on the surface of the SiC wafer (BPDs on a tip side) are converted to TEDs. As a result, TEDs propagate to the epitaxial layer 42, which causes reduction in BPD density of the epitaxial layer 42. However, Patent Document 1 describes that heating under inert gas (or in vacuum) is performed, and does not describe that a region around the SiC wafer is under Si vapor pressure. Accordingly, Si vapor is sublimated from the SiC wafer or other reactions occur by heating. This causes surface roughness on the conventional reformed SiC wafer 41 and causes low flatness on the conventional reformed SiC wafer 41.

Surface roughness on the reformed SiC wafer 41 propagates to the epitaxial layer 42 formed on the reformed SiC wafer 41. As such, since the epitaxial layer 42 obtained in the conventional invention has surface roughness and low flatness, the semiconductor devices manufactured by using the epitaxial layer 42 of the conventional invention may have performance that is reduced as semiconductor elements due to local concentration of an electric field, etc.

In contrast, the surface reforming step of this embodiment is a heat treatment under Si vapor pressure. Specifically, the untreated SiC wafer 40 having the off angle, while stored in the crucible 30, is heated under Si vapor pressure and up to a temperature of 1500° C. or more and 2200° C. or less, and desirably 1600° C. or more and 2000° C. or less by using the high-temperature vacuum furnace 10. In such heating, inert gas may be supplied in addition to Si vapor. A rate of etching of the untreated SiC wafer 40 can be reduced by supplying inert gas. The sources of vapors other than Si vapor and inert gas are not used. Under this condition, the surface of the untreated SiC wafer 40 is planarized and etched by heating the untreated SiC wafer 40. Specifically, the following reactions occur. Briefly, the untreated SiC wafer 40 is heated under Si vapor pressure, and thereby SiC of the untreated SiC wafer 40 sublimates into Si$_2$C or SiC$_2$, etc. due to thermal decomposition and chemical reaction with Si, while Si under Si atmosphere binds with C on the surface of the untreated SiC wafer 40 to cause self-assembly, so that planarization occurs.

$$SiC(s) \rightarrow Si(v)I + C(s)I \quad (1)$$

$$2SiC(s) \rightarrow Si(v)II + SiC_2(v) \quad (2)$$

$$SiC(s) + Si(v)I + II \rightarrow Si_2C(v) \quad (3)$$

Figure 6:
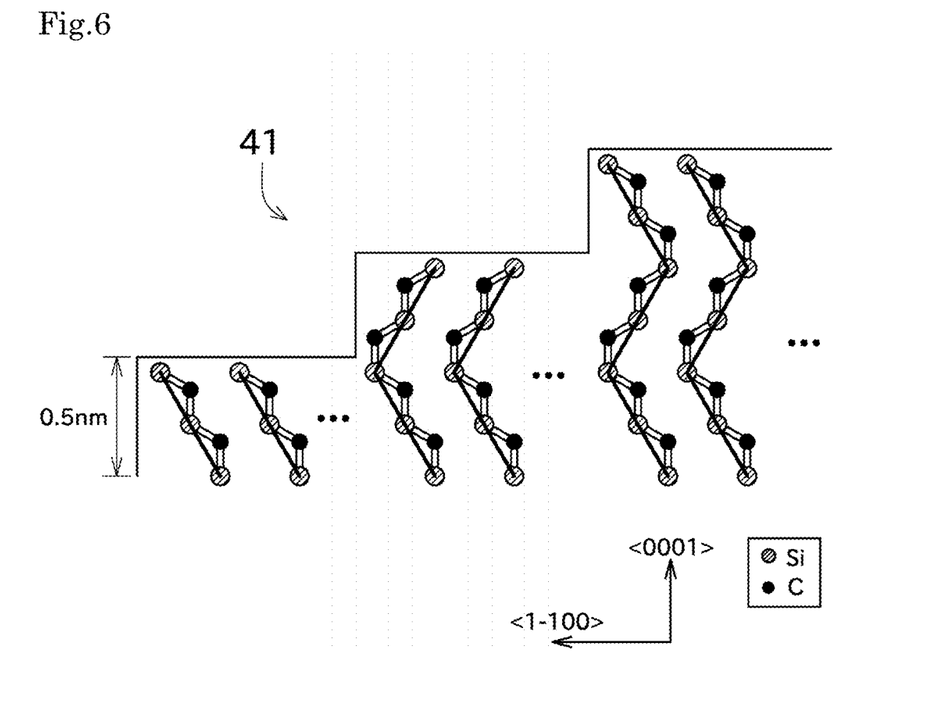
FIG. 6 A diagram schematically showing a structure of steps formed on a reformed SiC wafer after heating under Si vapor pressure.
Figure 7:
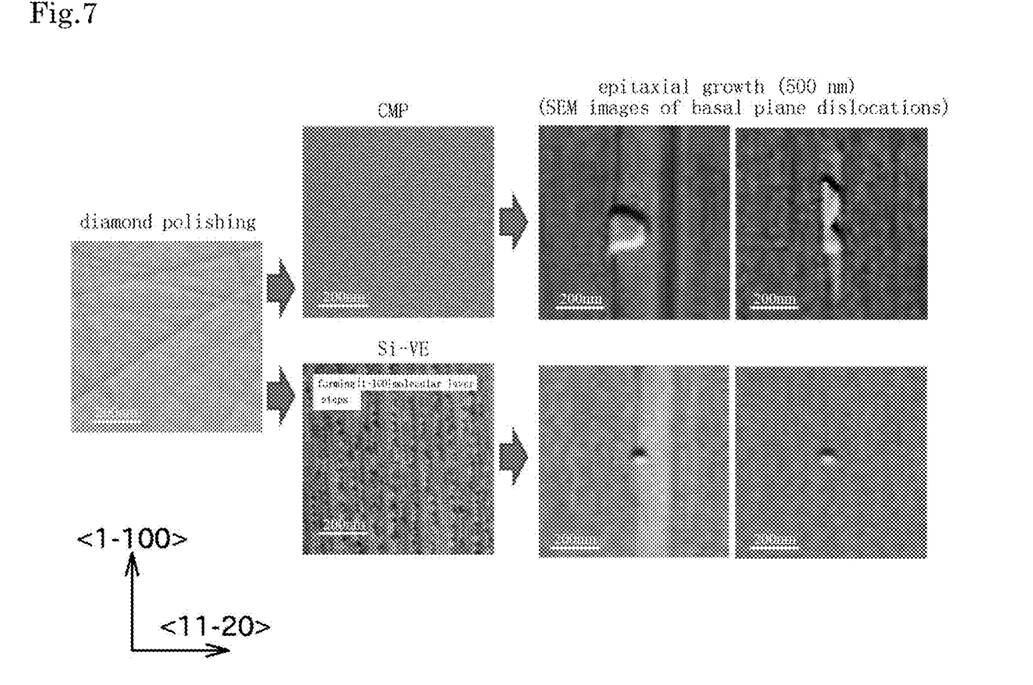
FIG. 7 SEM images showing that BPDs generated on a surface of the SiC wafer after CMP are dissolved on the reformed SiC wafer after heating under Si vapor pressure.

As such, {1-100} molecular layer steps shown in FIG. 7 are formed by planarizing the untreated SiC wafer 40. The reformed SiC wafer 41 manufactured in this embodiment is an SiC wafer having the {1-100} molecular layer steps. Each of the {1-100} molecular layer steps has eventually reached the same height. As shown in FIG. 6, SiC single crystal is configured that a stack direction (the direction in which molecular layers made of Si—C are stacked) is folded back in the <1-100> direction or its opposite direction every one-half period. In a case of 4H—SiC, when the distance in the stack directions of Si atoms and C atoms is considered as L, stack orientations of Si atoms and C atoms are reversed every 2 L (every half unit). In a case of 4H—SiC, each height of steps has eventually reached a half unit (two molecular layers) or full unit (four molecular layers) by performing the surface reforming step of this embodiment. FIG. 6 is a diagram schematically showing, in a case of 4H—SiC, the reformed SiC wafer 41 in which each height of steps has eventually reached the half unit. In a case of 6H—SiC, stack orientations of Si atoms and C atoms are reversed every 3 L (every half unit).

Therefore, performing the surface reforming step of this embodiment causes planarization on the surface of the reformed SiC wafer 41 at the molecular level. Therefore, in this embodiment, the chemical mechanical polishing step is unnecessary. FIG. 7 shows a result confirmed, on the SiC wafer subjected to CMP after mechanical polishing (diamond polishing) and on the reformed SiC wafer 41 subjected to heating under Si vapor pressure after mechanical polishing, shapes caused by BPDs after forming a trace amount (500 nm) of epitaxial layers on the main surfaces in order to confirm an initial stage of epitaxial growth, by using a scanning electron microscope. It has confirmed that the shape that is caused by BPDs on the back surface of the SiC wafer formed the trace amount of epitaxial layers after heating under Si vapor pressure is significantly smaller (for example, ½ or less, ⅓ or less) as compared with the shape that is caused by BPDs on the surface (main surface) of the SiC wafer formed the trace amount of epitaxial layers after CMP. The SiC wafer after CMP has an elongated shape caused by BPDs, while the reformed SiC wafer 41 of this embodiment mainly has a substantially circular shape caused by BPDs. The shape caused by BPDs is a morphology formed by forming the epitaxial layer in a portion of the SiC wafer where BPDs have appeared. Therefore, this kind of morphologies is reduced when a conversion of BPD to TED occurs. From the above, it can be assumed that the conversion of BPD to TED occurs in the reformed SiC wafer 41 of this embodiment.

As such, the {1-100} molecular layer steps are formed on the surface of the reformed SiC wafer of this embodiment, especially formed at a tip of BPD, which causes conversion "BPD→TED". The tip of BPD propagated from the surface of the reformed SiC wafer is reduced at the initial stage of growth of the epitaxial layer (the thickness of the epitaxial layer is 1 μm or less). Accordingly, "BPD→TED" may easily occur, and "BPD→BPD" may not occur. That is, when the surface reforming step is not performed, "BPD→TED" can occur on a portion having "BPD→BPD". In other words, property of the surface of the untreated SiC wafer 40 is changed so as to have higher conversion ratio of "BPD→TED", which can manufacture the reformed SiC wafer 41.

In the surface reforming step of this embodiment, since the size of BPDs is reduced at a time of forming the trace amount of epitaxial layers. Therefore, it is conceivable that BPDs are converted to TEDs mainly immediately after starting formation of the epitaxial layer 42. Accordingly, it is assumed that conversion of BPD to TED occurs near an interface between the reformed SiC wafer 41 and the epitaxial layer 42.

Next, the epitaxial layer forming step is implemented with respect to the reformed SiC wafer 41. Any method is adoptable for forming the epitaxial layer 42. For example, a solution growth method such as MSE method or a vapor phase epitaxy such as CVD method may be adoptable. As described above, since "BPD→TED" may easily occur on the reformed SiC wafer 41 as compared with the untreated SiC wafer 40, the epitaxial layer 42 of this embodiment has low BPD density. Although Patent Document 1 discloses a treatment method in which the epitaxial layer is formed further above the epitaxial layer, the epitaxial layer 42 as only one layer is formed in this embodiment. The epitaxial layer as only one layer means the epitaxial layer formed by one process of forming the epitaxial layer (continuous process of forming the epitaxial layer without suspension), does not mean the one molecular layer.

Next, experiments that found BPD reduction amount when performing the surface reforming step (heating under Si vapor pressure) of this embodiment will be described. Since BPD density is different for each SiC wafer, in these experiments, the common SiC wafer was subjected to different treatments to evaluate BPDs. To be specific, the following experiment 1 to experiment 3 were implemented. In the experiment 1, BPDs on the SiC wafer with the epitaxial layer formed after heating the SiC wafer under Si vapor pressure, was evaluated by a PL method (photoluminescence method) and an etch-pit method, respectively. In the experiment 2, BPDs on the SiC wafer used in the experiment 1, the SiC wafer after removing the epitaxial layer by polishing, and then performing CMP and forming the epitaxial layer, was evaluated by the PL method and the etch-pit method. In the experiment 3, BPDs on the SiC wafer used in the experiment 2, the SiC wafer after removing the epitaxial layer by polishing again, and then performing CMP without forming the epitaxial layer, was evaluated by the etch-pit method.

The SiC wafer used in these experiments was 2-inch wafer having an off angle. The epitaxial layer was formed by performing chemical vapor deposition method (CVD method) using monosilane ($SiH_4$) gas and propane ($C_3H_8$) gas in a temperature range of 1500-1600° C. The thickness of the epitaxial layer was approximately 9 μm. Laser used in the PL method was SICA88 manufactured by Lasertec Corporation. The excitation wavelength was 313 nm or more, and the detection wavelength was 750 nm or more. In the etch-pit method, a defect detection etching using molten alkali was firstly performed to visualize defects (BPDs, TEDs, TSDs, etc.), and then the SiC wafer was observed using an optical microscope to count the number of various defects. TSD means threading screw dislocation. Liquid in which potassium hydroxide (KOH) and sodium peroxide ($Na_2O_2$) were mixed in a ratio of 50:3 was used as molten alkali. The treatment temperature of the defect detection etching was 510° C.

Figure 8:
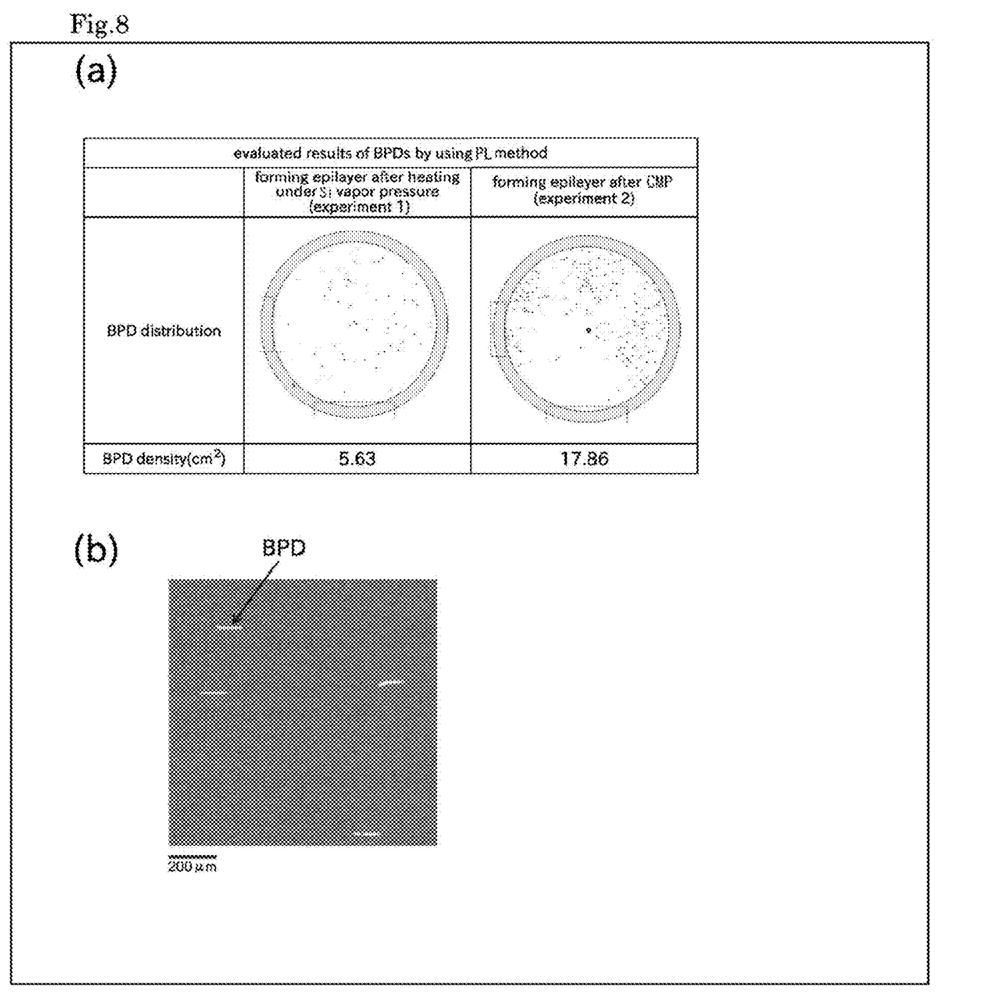
FIG. 8 A diagram showing experiment results evaluated BPDs by using a PL method.

FIG. 8 shows a result evaluated BPDs by the above-described PL method. FIG. 8 (a) shows BPD distribution and BPD density obtained by the PL method in the experiment 1 and the experiment 2. Fig. 8 (b) shows BPDs (light emission from a portion where BPDs exist) observed by the PL method. An edge of the SiC wafer (a ring-shaped portion shown in FIG. 8 (a)) had damages due to cutting and grinding. Therefore, BPDs except for a region of 3 mm from the edge of the SiC wafer was evaluated. BPD density in the SiC wafer with the epitaxial layer formed after heating under Si vapor pressure (experiment 1) was 5.63 ($cm^{-2}$), and BPD density in the SiC wafer with the epitaxial layer formed after CMP (experiment 2) was 17.86 ($cm^{-2}$).

Figure 9:
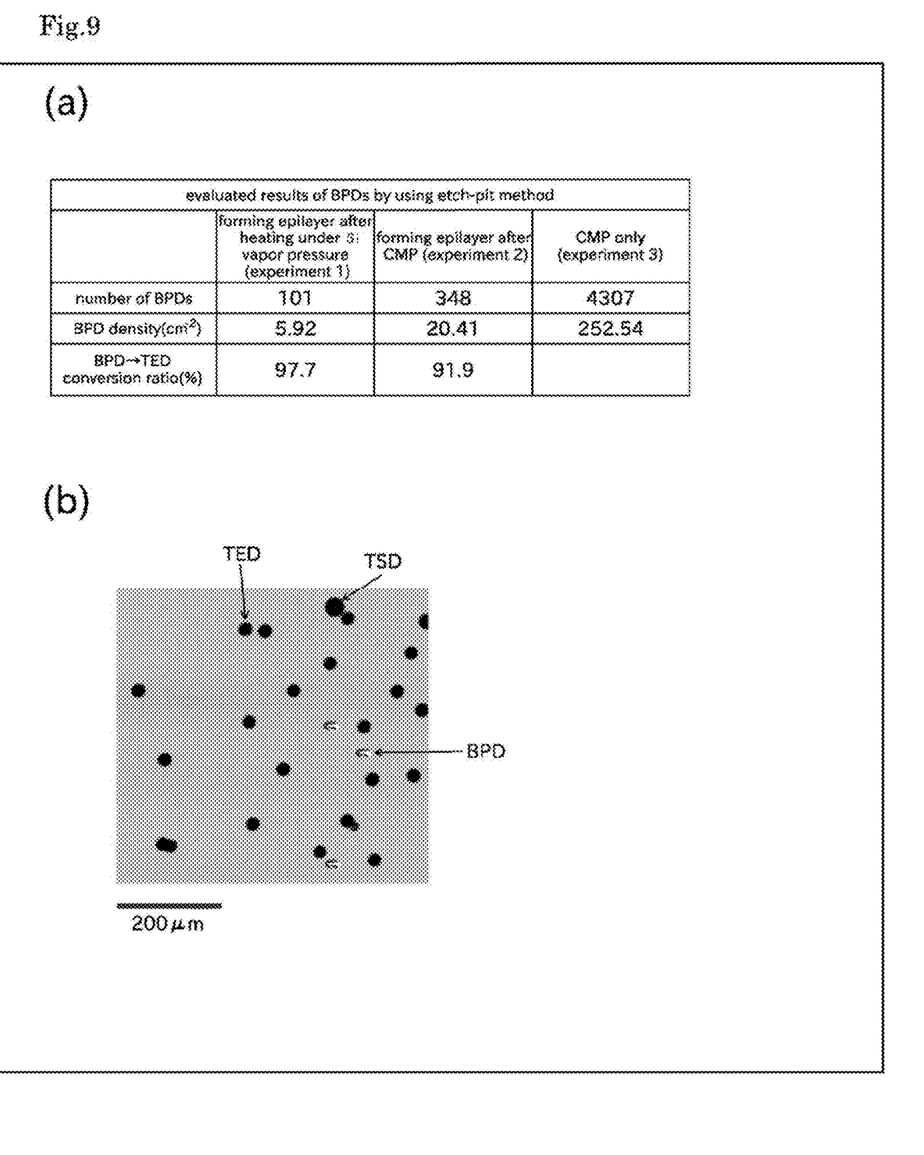
FIG. 9 A diagram showing experiment results evaluated BPDs by using an etch-pit method.

FIG. 9 shows a result in which BPDs were evaluated by the above-described etch-pit method. FIG. 9 (a) shows a table showing an experiment result. FIG. 9 (b) shows defects observed by the optical microscope. TED and TSD are dislocations perpendicular to the basal plane. Accordingly, a substantially circular pit was substantially parallel to the thickness direction of the SiC wafer was formed. Each TED had a smaller diameter than TSD. On the other hand, each BPD is a dislocation parallel to the basal plane. Accordingly, in the SiC wafer having the off angle, since the pit inclined with respect to the thickness direction was formed, the shape of this pit was slightly deformed. As such, TEDs, TSDs, and BPDs can be distinguished by the etch-pit method.

FIG. 9 (a) shows the number of BPDs and BPD density observed by the experiment 1 to the experiment 3. The experiment 3 shows the number of BPDs and BPD density before forming the epitaxial layer of the SiC wafer used in the experiment 1 or the experiment 2, because the epitaxial layers formed in the experiment 1 and experiment 2 were removed by polishing. BPDs propagate to the epitaxial layer as BPDs, or BPDs are converted to TEDs and then propagate to the epitaxial layer. As above, the ratio of remaining BPD (%) can be calculated by dividing "BPD density (or the number of BPDs) observed in the experiment 1" by "BPD density (or the number of BPDs) observed in the experiment 3" and converting them into percentage indication. The ratio of BPD converted to TED (i.e., conversion ratio) can be calculated by subtracting the remaining BPD ratio from 100. FIG. 9 (a) shows the conversion ratio in the experiment 1 and the conversion ratio in the experiment 2, which are calculated by the above-described processes. In the etch-pit method, BPDs except for a region of 2 mm from the edge of the SiC wafer was evaluated, for the same reason as the PL method.

BPD density in the experiment 1 evaluated by the etch-pit method was 5.92 ($cm^{-2}$), and BPD density in the experiment 2 was 20.41 ($cm^{-2}$). These values approximated the value evaluated by the PL method. Thereby, it was confirmed that the detection result was valid. Moreover, comparing both of the values, in the experiment 1 (this embodiment), BPD density was ½ or less (more specifically, ⅓ or less) compared to the experiment 2 (conventional invention).

The conversion ratio in the experiment 1 was 97.7%, and the conversion ratio in the experiment 2 was 91.9%. That is, the ratio of remaining BPD in the experiment 1 was 2.3%, and the ratio of remaining BPD in the experiment 2 was 7.1%. Therefore, unlike the experiment 2 (conventional invention), in the experiment 1 (this embodiment), the ratio of remaining BPD was 5% or less. As above, it has confirmed that, by performing the surface reforming step of this embodiment, BPDs on the surface of the SiC wafer are easily converted to TED at a time of forming the epitaxial layer.

The conversion ratio was 5.8% by subtracting the conversion ratio (91.9%) in the experiment 2 from the conversion ratio (97.7%) in the experiment 1. This means that, 5.8% of BPD in the entire BPD was further converted to TED (the conversion ratio was improved by 5.8%) by heating with Si vapor pressure etching, as compared with a case of performing CMP. That is, the above-described (1) "BPD→TED" conversion due to formation of the {1-100} molecular layer steps at the tip of BPD, and (2) promotion of conversion "BPD→TED" due to a small tip of BPD at the initial stage of growth of the epitaxial layer, (1) and (2) cause an increase in the conversion ratio by 5% or more (specifically, 5.8%). Although the conversion ratio in performing CMP varies depending on conditions, considering that the conversion ratio is around 90%, a room for improving the conversion ratio (an upper limit of improvement in the conversion ratio) is 10% at most.

Figure 10:
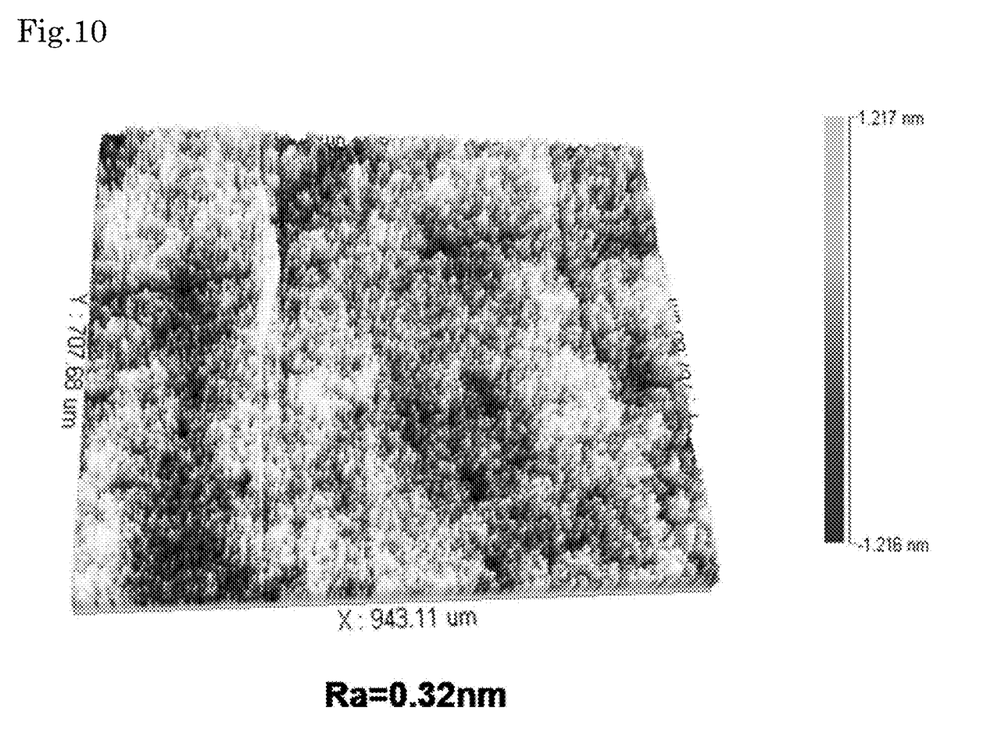
FIG. 10 A diagram showing a measurement result of surface roughness of the epitaxial layer formed on the reformed SiC wafer after heating under Si vapor pressure, by using a white-light interference microscope.

As described above, since the surface of the reformed SiC wafer 41 has very high flatness, the epitaxial layer 42 formed in this embodiment has also very high flatness. To be specific, the surface roughness on the surface of the epitaxial layer 42 obtained by the above-described condition 2, especially on a 943 μm×708 μm rectangular region was measured by using a white-light interference microscope. The measurement result of the surface roughness (arithmetic mean roughness) was Ra=0.32 nm, as shown in FIG. 10. As such, the epitaxial layer 42 is formed on the reformed SiC wafer 41 of this embodiment, which can form the epitaxial layer 42 having the surface roughness of 1 nm or less and, depending on conditions, further lower 0.5 nm or less. In the method shown in Non-Patent Document 1, the surface roughness was Rms=1.5 nm although the unit was different. This is because the surface roughness of the SiC wafer deteriorates due to heat treatment before forming the epitaxial layer, in the aftermath, the surface roughness of the epitaxial layer deteriorates.

As such, performing the method of this embodiment enables the epitaxial layer-formed SiC wafer 43 having the epitaxial layer 42 with low BPD density and high flatness to be manufactured. With such epitaxial layer-formed SiC wafer 43, the high-performance semiconductor devices, in which conduction in bipolar semiconductor elements such as PIN diodes and IGBTs is less likely to be degraded and electric field concentration is less likely to occur, can be manufactured. Such semiconductor devices are suitable particularly for applications such as switching elements requiring a high withstand voltage (several kV to several tens of kV).

In the surface reforming step of this embodiment, the untreated SiC wafer 40 is planarized and its surface is etched. In this step, the rate of etching is higher as the heating rate is higher, as the inert gas pressure is lower, and as the Si pressure is higher. Therefore, in consideration of the above, performing high-speed etching enables at least a part of the mechanical processing step to be omitted.

As described above, in the method for manufacturing the reformed SiC wafer 41 of this embodiment (a surface treatment method for the SiC wafer), the method for manufacturing the reformed SiC wafer 41 on which its surface is reformed by treating the untreated SiC wafer 40 before formation of the epitaxial layer 42, the method includes the following surface reforming step. That is, the untreated SiC wafer 40 includes BPDs as dislocations parallel to the inside of the (0001) face, and TED. Property of the surface is changed so as to have higher rate in which portions having BPDs on the surface of the untreated SiC wafer 40 propagate as TEDs at a time of forming the epitaxial layer 42.

Accordingly, property of the surface, not an inside of the untreated SiC wafer 40, is changed to form the reformed SiC wafer 41, and to grow the epitaxial layer on the reformed SiC wafer 41 manufactured as above. This can convert from BPDs for degrading property of the semiconductor devices to TEDs that do not affect performance of the semiconductor devices. Therefore, it is possible to manufacture the reformed SiC wafer 41 suitable for manufacturing of high-performance semiconductor devices. Particularly, BPDs can be reduced in a short treatment time by changing property of the surface, not the inside of the untreated SiC wafer.

In the method for manufacturing the reformed SiC wafer 41 of this embodiment, the surface reforming step is performed with respect to the untreated SiC wafer 40 that is manufactured from the ingot 4 into an wafer shape and then subjected to mechanical processing without chemical mechanical polishing.

Accordingly, in the above-described surface reforming step, since not only BPD density at a time of forming the epitaxial layer 42 is reduced but also the surface is planarized, chemical mechanical polishing is unnecessary. This can reduce the number of steps at a time of manufacturing the reformed SiC wafer 41.

In the method for manufacturing the reformed SiC wafer 41 of this embodiment, by performing the surface reforming step, the arithmetic mean roughness on the surface after forming the epitaxial layer is 1 nm or less.

Accordingly, the SiC wafer having low BPD density while planarizing the surface, which can manufacture high-performance semiconductor devices.

In this embodiment, the epitaxial layer forming step of forming the epitaxial layer 42 is performed with respect to the reformed SiC wafer 41 to manufacture the epitaxial layer-formed SiC wafer 43.

In this embodiment, the conversion ratio of BPD to TED that is achieved by performing the surface reforming step with respect to the untreated SiC wafer 40 to form the {1-100} molecular layer steps, and by performing the epitaxial layer forming step with respect to the reformed SiC wafer 41 to reduce the size of BPDs at the initial stage of such formation, is 5% or more higher than the conversion ratio when the epitaxial layer 42 is formed after performing CMP with respect to the untreated SiC wafer 40.

As above, the epitaxial layer-formed SiC wafer 43 having low BPD density can be manufactured.

In the surface reforming step of this embodiment, BPDs generated on the surface of the untreated SiC wafer 40 are converted to TEDs.

The epitaxial layer-formed SiC wafer 43 of this embodiment includes the reformed SiC wafer 41 and the one epitaxial layer 42. BPDs are included on the surface of the reformed SiC wafer 41. BPD density on the surface of the epitaxial layer 42 is 5% or less of BPD density on the surface of the reformed SiC wafer 41 (specifically, slightly inside of the surface that is not affected by the surface reforming step; i.e., immediately below the surface).

While a preferred embodiment of the present invention has been described above, the above-described configuration can be modified, for example, as follows.

A manufacturing step described in FIG. 3 etc. are illustrative examples. An order of steps can be switched, a part of steps can be omitted, and other steps can be added. For example, a step of cleaning the surface by hydrogen etching may be performed, after the surface reforming step and before forming the epitaxial layer, for example. The process for inspecting BPD density may be performed after the epitaxial layer forming step.

The temperature condition, the pressure condition, and the like, adopted in the above-described embodiment are illustrative examples, and they can be changed as appropriate. A heating apparatus (a high-temperature vacuum furnace having plural internal spaces) other than the above-described high-temperature vacuum furnace 10, polycrystalline SiC wafer, and a container having shapes or materials unlike the crucible 30, may be used. For example, it may be acceptable that an external shape of the storing container is not limited to a cylindrical shape, and may have a cubic shape, or a rectangular parallelepiped shape.

DESCRIPTION OF THE REFERENCE NUMERALS

4 ingot
10 high-temperature vacuum furnace
30 crucible
40 untreated SiC wafer
41 reformed SiC wafer
42 epitaxial layer
43 epitaxial layer-formed SiC wafer

The invention claimed is:

1. A method for manufacturing a reformed SiC wafer having a surface that is reformed by processing an untreated SiC wafer that is an SiC wafer before formation of an epitaxial layer and that includes at least in a surface, thereof basal plane dislocations as dislocations parallel to an inside of a (0001) face, the method comprising:
   a surface reforming step comprising forming {1-100} molecular layer steps on the surface of the untreated SiC wafer,
   wherein the surface reforming step changes property of the surface of the untreated SiC wafer so that the basal plane dislocations on the surface of the untreated SiC wafer propagate as threading edge dislocations at a higher rate at a time of forming the epitaxial layer.

2. A method for manufacturing a reformed SiC wafer having a surface that is reformed by processing an untreated SiC wafer that is an SiC wafer before formation of an epitaxial layer and that includes at least in a surface, thereof basal plane dislocations as dislocations parallel to an inside of a (0001) face, the method comprising:
   a surface reforming step that comprises reforming the surface of the untreated SiC wafer by forming {1-100} molecular layer steps on the surface of the untreated SiC wafer.

3. The method for manufacturing the reformed SiC wafer according to claim 2, wherein
   in the surface reforming step, the basal plane dislocations generated on the surface of the untreated SiC wafer are converted to threading edge dislocations.

4. The method for manufacturing the reformed SiC wafer according to claim 3, wherein
   the untreated SiC wafer is subjected to planarization during the surface reforming step.

5. The method for manufacturing the reformed SiC wafer according to claim 3, wherein
   performing the surface reforming step causes an arithmetic mean roughness (Ra) of the epitaxial layer formed on the surface of the reformed SiC wafer to be 1 nm or less.

6. The method for manufacturing the reformed SiC wafer according to claim 5, wherein
   in the surface reforming step, the untreated SiC wafer is heated under Si vapor pressure.

7. A method for manufacturing an epitaxial layer-formed SiC wafer comprising:
   an epitaxial layer forming step of forming the epitaxial layer on the reformed SiC wafer manufactured by the method for manufacturing the reformed SiC wafer according to claim 1.

8. The method for manufacturing the epitaxial layer-formed SiC wafer according to claim 7, wherein
   a conversion ratio (%) of basal plane dislocation to threading edge dislocation, that is realized by performing the surface reforming step with respect to the untreated SiC wafer to form {1-100} molecular layer steps, and by performing the epitaxial layer forming step with respect to the reformed SiC wafer to reduce the size of the basal plane dislocations at an initial stage of such formation of the epitaxial layer, is 5% or more higher than the conversion ratio (%) when the epitaxial layer is formed after performing chemical mechanical polishing with respect to the untreated SiC wafer.

9. An epitaxial layer-formed SiC wafer comprising:
   an SiC wafer; and
   an epitaxial layer formed on the SiC wafer, wherein the surface of the SiC wafer includes basal plane dislocations as dislocations parallel to an inside of a (0001) face,
   density of the basal plane dislocation on the surface of the epitaxial layer is 5% or less of density of the basal plane dislocation on the surface of the SiC wafer, and
   {1-100} molecular layer steps are formed on the surface of the SiC wafer:.

10. The epitaxial layer-formed SiC wafer according to claim 9, wherein
    an arithmetic mean roughness (Ra) on the surface of the epitaxial layer of the SiC wafer is 1 nm or less.

11. The epitaxial layer-formed SiC wafer according to claim 9, wherein
    a conversion ratio (%) as a ratio in which the basal plane dislocations on the surface of the SiC wafer are converted to threading edge dislocations in the epitaxial layer, is 5% or more higher than the conversion ratio (%) when the epitaxial layer is formed after performing chemical mechanical polishing with respect to the SiC wafer.

12. The epitaxial layer-formed SiC wafer according to claim 9, wherein
    only one epitaxial layer is formed on the SiC wafer,
    density of the basal plane dislocation on the surface of the epitaxial layer is 5% or less of density of the basal plane dislocation on the surface of the SiC wafer.

* * * * *